United States Patent [19]

Sagisaka

[11] Patent Number: 5,394,298
[45] Date of Patent: Feb. 28, 1995

[54] SEMICONDUCTOR DEVICES

[75] Inventor: Katsumi Sagisaka, Ohgaki, Japan

[73] Assignee: Ibiden Co., Ltd., Japan

[21] Appl. No.: 190,523

[22] Filed: Feb. 2, 1994

[30] Foreign Application Priority Data

Mar. 26, 1993 [JP] Japan ................... 5-090573

[51] Int. Cl.⁶ .................. H05K 7/20; H01L 23/28
[52] U.S. Cl. .................... 361/704; 174/52.2;
361/709; 361/736; 257/690; 257/695; 257/706;
257/707; 257/787; 257/796
[58] Field of Search .............. 437/211, 215, 217, 219;
257/687, 690–693, 695–696, 700, 706–707, 787,
796; 361/704, 707, 709, 711, 728, 730, 736;
174/52.2

[56] References Cited
U.S. PATENT DOCUMENTS 5,012,386 4/1991 McShane et al. .............. 361/715
5,332,864 7/1994 Liang et al. .............. 361/736

FOREIGN PATENT DOCUMENTS 60-244074 12/1985 Japan .

Primary Examiner—Bot Ledynh
Attorney, Agent, or Firm—Parkhurst, Wendel & Rossi

[57] ABSTRACT

A semiconductor device comprises a semiconductor chip carrier and a semiconductor chip packaged therein with a resin. The semiconductor chip carrier comprises a printed wiring substrate with conductor patterns, a first adhesive layer formed on at least an outer peripheral portion of the substrate, a second adhesive layer formed on the conductor pattern of the substrate, a lead frame joined to the substrate through the adhesive layers and comprised of plural leads for external connection. The conductor pattern is electrically connected to a part of inner leads of the lead frame.

4 Claims, 5 Drawing Sheets

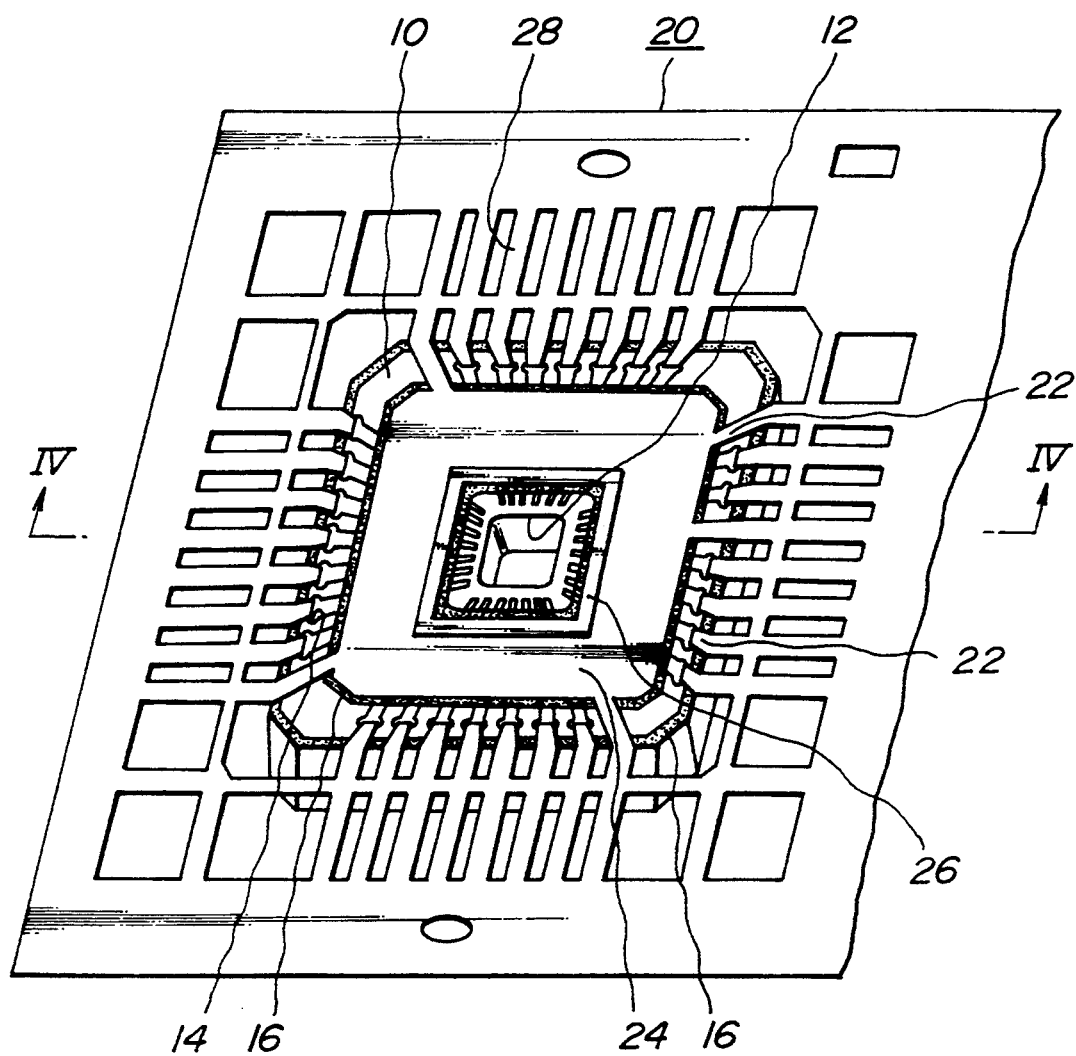
FIG_3

FIG_4
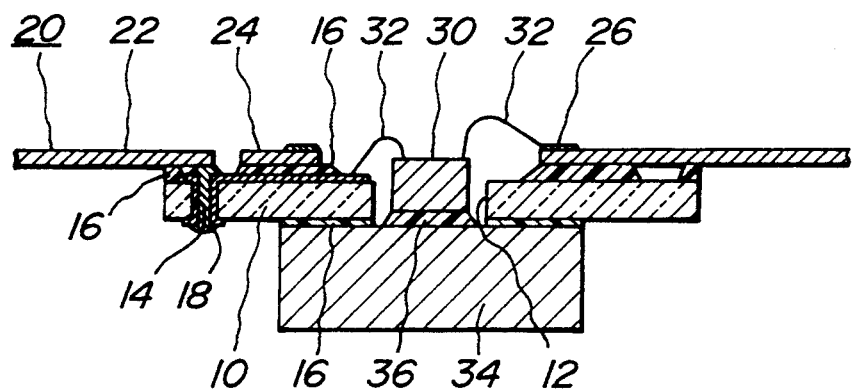
FIG_5
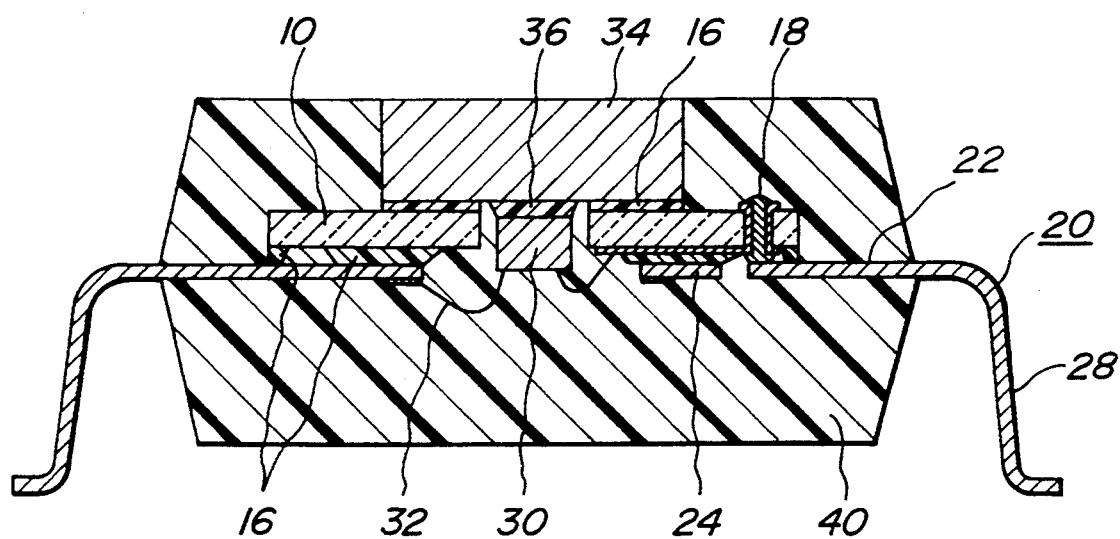

FIG_6
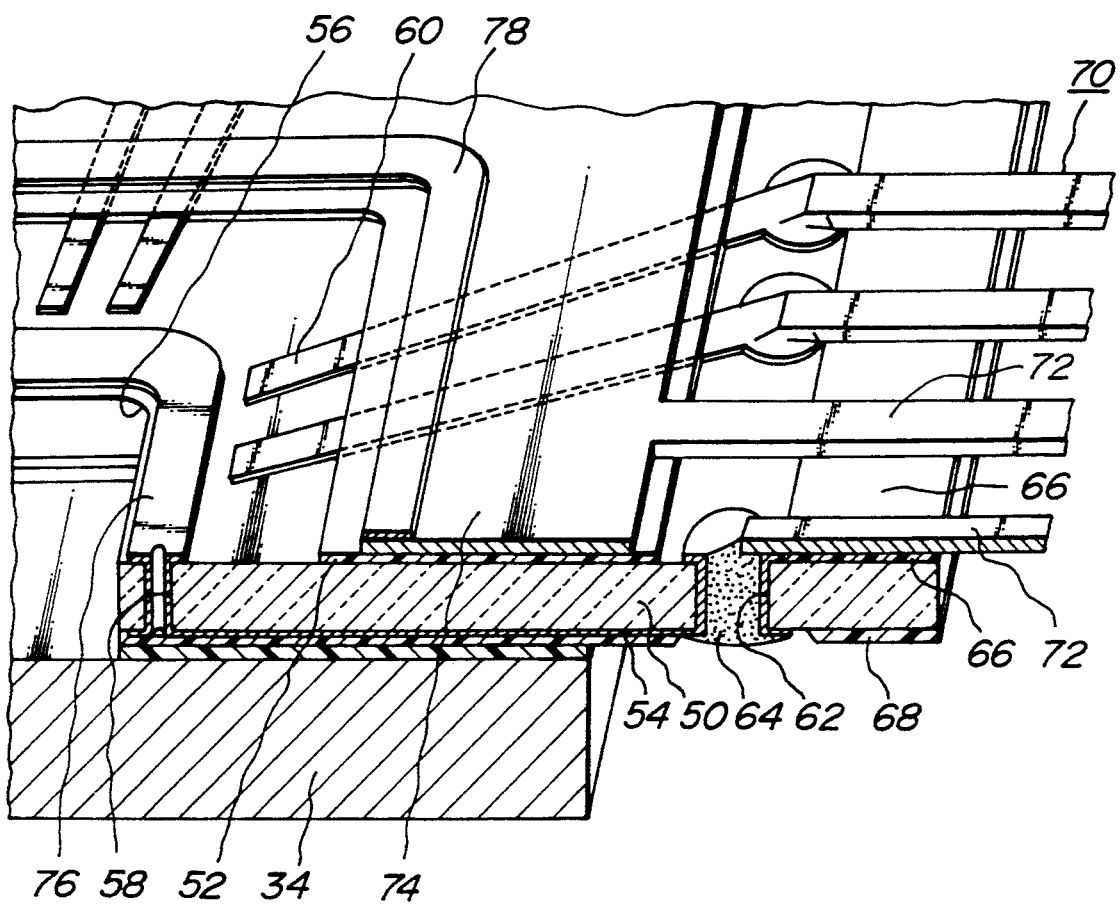

FIG_7
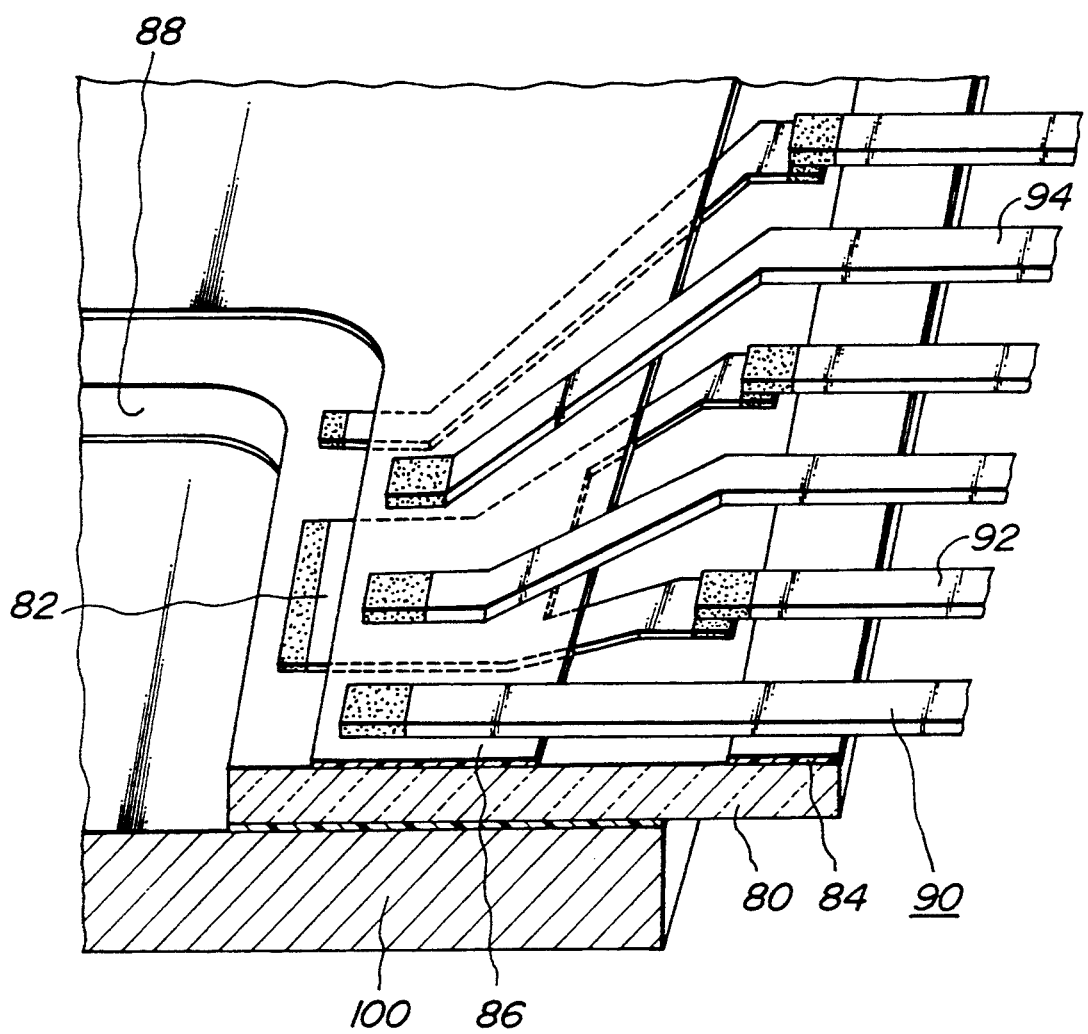

SEMICONDUCTOR DEVICES

BACKGROUND OF THE INVENTION

1. Field of the Invention

This invention relates to a semiconductor device, and more particularly to a semiconductor device having structural characteristics in the vicinity of lead frame for mounting a semiconductor chip or the like, and separately acting an electrical connecting function and a physical holding function between a semiconductor chip and a printed wiring substrate.

2. Description of the Related Art

In semiconductor chips as a center of a semiconductor device, it is demanded to satisfy the following requirements with respect to a gate array element mainly used in a microprocessor unit (MPU) or a semiconductor chip for OEM use (so-called custom IC). That is, there are demanded requirements of (1) reducing lead inductance for the control of switching noise; (2) efficiently dissipating heat generated due to the increase of power consumed with high speed operation; (3) fining an inner lead in accordance with the increase of input and output terminal number and the fineness of electrodes on the semiconductor element; (4) mounting multi-chips on a single printed wiring substrate for the enlargement of applicable functions; and so on.

In order to satisfy the above requirements, there are proposed various means having the following merits, i.e. (1) the lead inductance may be reduced by rendering the substrate into multi-layer structure; (2) the heat dissipation is surely improved by mounting a heat sink onto a rigid substrate; (3) the inner lead may be fined by utilizing a workability of the substrate; (4) the multi-chips may be mounted on the single substrate by increasing the degree of freedom in the design of the substrate; and so on. These means can effectively be applied to semiconductor devices each provided with an electronic component carrier formed, for example, by joining the substrate with the lead frame.

A first embodiment of the conventional semiconductor device as shown in Japanese Patent laid open No. 59-98545 is shown in FIG. 1. In this case, a given conductor pattern 2 is formed on an upper surface of a substrate 1 composed of a glass epoxy material and connected to a semiconductor chip 3 arranged on a proper position of the substrate 1 through an adhesive 7 with gold wires 4. Furthermore, the conductor pattern 2 is joined to a lead frame 5 for the connection to a given external element through soldering, while a through-hole 6 is formed in the substrate 1 at a position joined to the lead frame 5. Moreover, such an assembly is locally packaged with a mold resin 8 around the semiconductor chip 3.

A second embodiment of the conventional semiconductor device as shown in Japanese Patent laid open No. 59-98545 is shown in FIG. 2. In this case, a given conductor pattern 2 is formed on an upper surface of a substrate 1 composed of a glass epoxy material and connected to a semiconductor chip 3 mounted on a proper place of the substrate 1 with gold wires 4. Furthermore, the conductor pattern 2 is joined to a lead frame 5 for the connection to a given external element through soldering 9. Such an assembly is packaged with a mold resin 8 as a whole.

In the above conventional technique, however, there are the following problems.

[1] Both of electrical connecting function and physical holding function are generally included in the joint portion between the lead frame and the substrate. In the aforementioned conventional technique, it is expected to secure both of electrical connecting function and physical holding function in a joint portion of a main part only by soldering. Now, when such a joint portion is reviewed with respect to the lead frame for mounting high-performance semiconductor chip, it is usually related to QFP (Quad Flat Package) capable of having input and output multi-terminals. In such a QFP structure, the joint portion is formed in the outer periphery of four sides, but means for releasing stress based on the difference in thermal expansion between the lead frame and the substrate is not formed, so that such a stress is stored in the joint portion. As a result, when conducting, for example, a life test of a final product, breakage is caused in the joint portion and hence breakage is caused in respective wiring portion.

[2] Since there is a state of completely connecting the lead frames to the conductor pattern of the substrate, the functions inherent to the substrate serving as internal wiring portion and semiconductor chip mounting portion are lost from the lead frame and hence the effective utility is obstructed and the degree of freedom in the design of the substrate is not sufficiently applied.

[3] In the joining between the lead frame and the substrate, it is desirable to reduce the joint number as far as possible from viewpoints of increase of wiring resistance and degradation of joining reliability in the joint portion, but the reduction of the joint number to a desired number can not be attained.

SUMMARY OF THE INVENTION

It is, therefore, an object of the invention to solve the problems of the conventional techniques and to provide a semiconductor device having structural characteristics in the vicinity of lead frame for mounting a semiconductor chip or the like, and separately acting an electrical connecting function and a physical holding function between a semiconductor chip and a printed wiring substrate.

According to the invention, there is the provision of a semiconductor device comprising a semiconductor chip carrier and a semiconductor chip packaged in the semiconductor chip carrier with a resin; said semiconductor chip carrier comprising a printed wiring substrate provided at at least both surfaces with conductor patterns, a first layer of an adhesive formed on at least an outer peripheral portion of a front surface of the substrate, a second layer of an adhesive formed on the conductor pattern of the substrate, a lead frame joined to the substrate through the adhesive layers and comprised of plural leads for external connection, and said conductor pattern being electrically connected to a part of inner leads of the lead frame.

In a preferred embodiment of the invention, the semiconductor chip is directly mounted on a heat sink disposed on the substrate.

In the semiconductor device according to the invention, the electrical connecting function and the physical connecting function are separately attained different from the conventional technique of simultaneously attaining the electrical connecting function and the physical connecting function in the given joint portion. That is, the lead frame used for external connecting terminal is joined to the semiconductor chip carrier through the given adhesive layers, while the inner leads of the lead frame are disposed on the conductor pattern of the substrate.

The semiconductor device according to the invention has the following advantages:
(1) Thermal stress is dispersed into the adhesive layer arranged on the outer periphery of the substrate and the electrical connecting portion to improve stress resistance;
(2) Since a part of the lead frame is utilized as a printed wiring substrate, the connection to the respective semiconductor chip has a so-called tier type structure and hence the effective wiring density is increased. Furthermore, there are suppressed occurrences of wire crossing and short-circuit based on a resin flow in the molding;
(3) The joint number in the device can surely be reduced in accordance with a given design for ground wire and various signal wires; and the like.

BRIEF DESCRIPTION OF THE DRAWINGS

FIG. 3 is a schematically perspective view of a first embodiment of the semiconductor chip carrier used in the semiconductor device according to the invention;

FIG. 4 is a sectional view taken along a line IV—IV of FIG. 3;

FIG. 5 is a diagrammatically sectional view of an embodiment of the semiconductor device formed by mounting a semiconductor chip on the semiconductor chip carrier shown in FIG. 3 and packaging them with a resin;

FIG. 6 is a partly perspective view partly shown in section of a second embodiment of the semiconductor chip carrier used in the semiconductor device according to the invention; and FIG. 7 is a partly perspective view partly shown in section of a third embodiment of the semiconductor chip carrier used in the semiconductor device according to the invention.

DESCRIPTION OF PREFERRED EMBODIMENTS

Figure 1:
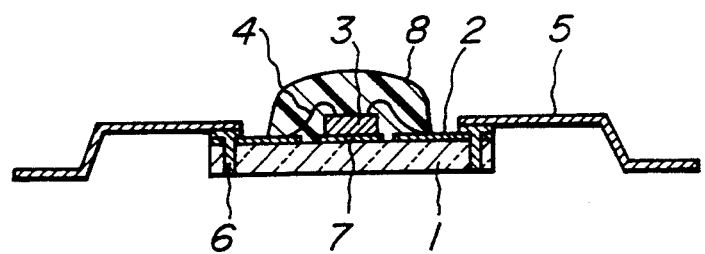
FIG. 1 is a diagrammatically sectional view of an embodiment of the conventional semiconductor device.
Figure 2:
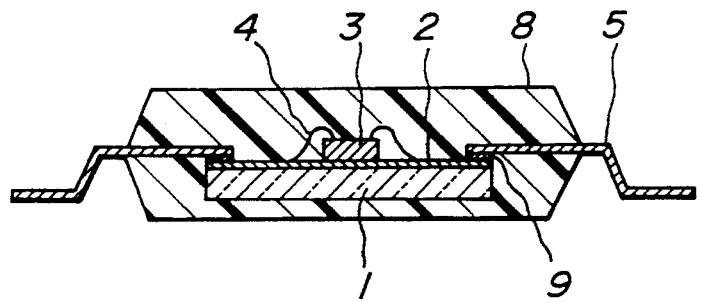
FIG. 2 is a diagrammatically sectional view of another embodiment of the conventional semiconductor device.

In FIGS. 3 and 4 is schematically shown a first embodiment of the semiconductor chip carrier used in the semiconductor device according to the invention. As shown in FIGS. 3 and 4, a printed wiring substrate 10 (thickness: 0.2 mm) made from a proper base material (e.g. bismaleimidotriazole resin) is provided at its proper portion (e.g. central portion) with a cavity 12 for mounting a given semiconductor chip and through-holes 14 are formed in the substrate at given positions. On the other hand, a lead frame 20 composed of a given metal foil (e.g. MF202-H made by Mitsubishi Electric Corporation, thickness: 0.15 mm) is disposed on an upper surface of the substrate 10 in place, in which a part of inner leads 22 forms a ground ring 24 as a ground layer. The remaining inner leads 22 are electrically connected to conductor pattern formed on the substrate 10 through the through-holes 14 with a proper solder, in which the conductor pattern is located beneath the ground ring 24. The ground ring 24 is provided at its upper surface in the vicinity of the cavity 12 with a silver plated layer 26, which is directly connected to a ground electrode (not shown) of a semiconductor chip 30 to be mounted through a proper connecting means such as gold wire 32. On the other hand, a signal wire of the semiconductor chip 30 is connected to the gold-plated conductor pattern of the substrate 10 electrically connected to the remaining inner leads 22, whereby not only the formation of fine pattern but also the mounting of a miniaturized semiconductor chip can be attained. Moreover, an outer lead 28 is extended outward from the respective inner lead 22 in the lead frame so as to connect to the other circuit or the like in a given assembling operation. The printed wiring substrate 10 and the lead frame 20 are joined to each other through a layer 16 of a given adhesive (e.g. an epoxy resin). The semiconductor chip carrier shown in FIGS. 3 and 4 corresponds to multipin-type QFP and is shown as only one piece of the lead frame for multiple pattern.

In FIG. 4 is sectionally shown a state taken along a line IV—IV of FIG. 3. As shown in FIG. 4, the inner lead 22 of the lead frame 20 or the neighborhood thereof is joined to the front surface of the printed wiring substrate 10 through the adhesive layer 16 (thickness: about 40 $\mu$m) formed in place around the cavity 12. The adhesive layer 16 is composed of a thermosetting resin having a high heat resistance such as epoxy resin, polyimide resin, triazine resin or the like. Moreover, the thickness of the adhesive layer is desirable to be thicker than a height of a connection pad for the conductor pattern formed on the surface of the substrate surrounding the through-hole before the joining between the substrate and the lead. When the thickness is thinner than the height of the pad, the sufficient adhesion strength between the lead and the substrate can not be obtained. When it is too thick, the adhesive flows in the heating under pressure to cover the connection pad and the through-hole, so that the connection reliability considerably lowers. In general, the height of the connection pad is 15–50 $\mu$m, preferably 30–40 $\mu$m, so that the thickness of the adhesive layer is desirable to be thicker by 5–50 $\mu$m than the height of the connection pad. Preferably, the thickness of the adhesive layer is 40–60 $\mu$m.

As shown in FIG. 4, the through-hole 14 is fixed to the top of each lead frame 22 in the lead frame 20 through a solder 18. As the solder 18, a so-called 9:1 solder formed by mixing tin with lead at a mixing ratio of 9:1 is preferably used. Furthermore, a heat sink 34 is made from an oxygen-free copper material and adhered to the rear surface side of the substrate 10 through another adhesive layer 16. Moreover, the semiconductor chip 30 is disposed on the upper surface of the heat sink 34 through a die paste 36 and connected to a bonding surface of the inner lead 22 and a bonding surface of the conductor pattern of the substrate 10 through gold wires 32. In this case, a difference in height between the bonding surface of the inner lead and the bonding surface of the conductor pattern is about 0.190 mm, so that it is possible to eliminate the crossing between wires and the abnormal approach therebetween in the fine wire bonding operation and hence the high connection reliability can be attained. Since the adhesive layer 16 is also formed on the outer peripheral portion of the substrate 10, stress applied to the electrical connecting portion through the solder 18 is adequately dispersed at the assembling step and hence the reliability after the molding with a resin is largely improved.

FIG. 5 shows a first embodiment of a semiconductor device formed by mounting the semiconductor chip 30 on the semiconductor chip carrier as shown in FIG. 4 and packaging them with a resin 40. In FIG. 5, the up and down relation of the substrate is turned to the case of FIG. 4. A surface of a semiconductor chip 30 inserted into the cavity 12 of the substrate 10 is joined to a surface of the heat sink 34 (lower surface of the heat sink in FIG. 4) through the die paste 36, while electrical connecting portions (not shown) in the other surface of the semiconductor chip 30 are connected to the ground ring 24 and inner leads 22 of the lead frame 20 through gold wires, respectively. After the mounting of the semiconductor chip, a main part of the resulting assembly is packaged with a transfer-molding resin 40. Moreover, the other surface of the heat sink 34 is exposed to air as shown in FIG. 5.

FIG. 6 schematically shows a second embodiment of the semiconductor chip carrier used in the semiconductor device according to the invention. In FIG. 6, a printed wiring substrate 50 is made from a base material of heat-resistant epoxy resin provided at both surfaces with conductor patterns (thickness: 0.4 mm). A lead frame 70 is made from a copper alloy of KLF-125 (trade name) having a thickness of 0.150 mm. A part of inner leads 72 in the lead frame 70 is properly enlarged to form a ground ring 74, which is adhered to the front surface of the substrate 50 through a layer 52 of an adhesive formed thereon. The conductor pattern 54 formed on the rear surface of the substrate 50 as a given power layer is electrically connected to a ground ring 76 formed on the substrate in the vicinity of a cavity 56 through a through-hole 58. The ground ring 76 fulfills not only a function of reducing inductance but also an action as a radiating plate, so that good radiating property can be attained. The remaining inner leads 72 (other than the inner lead 72 connected to the ground ring 74) in the lead frame 70 are electrically connected to the conductor pattern 54 and conductor pattern 60 of the substrate 50 through high-melting solder 64 (i.e. 9:1 solder made from tin and lead) filled in through-holes 62, respectively. As a result, when a semiconductor chip (not shown) is assembled in the thus formed semiconductor chip carrier and packaged with a mold resin at given temperature (175° C.) and pressure (100 kg/cm²), there is caused no solder flowing and deformation in the electrically connected portions and hence the good resistance to the assembling can be ensured. Moreover, the inner leads 72 are adhered to the substrate 50 through a layer 66 of an adhesive formed on the outer peripheral portion thereof. In the adhesive layers 52 and 66, a heat-resistant epoxy resin sheet (thickness: about 40 μm) is used as an adhesive. Particularly, the substrate 50 is adhered to the ground ring 74 of a large area through the adhesive layer 52, whereby the deformation of the substrate based on the temperature and pressure in the packaging can considerably be decreased. In FIG. 6, numeral 68 is a solder resist layer and numeral 78 is a silver plated layer.

FIG. 7 schematically shows a third embodiment of the semiconductor chip carrier used in the semiconductor device according to the invention. In FIG. 7, a printed wiring substrate 80 is made from a low thermal expansion base material of epoxy/aramide resins (thickness: 0.2 mm). A lead frame 90 is made of 42 alloy having a thickness of 0.127 mm. A conductor pattern 82 formed on the front surface of the substrate 80 and inner leads 92 of the lead frame 90 are subjected at their top portions to gold plating and then electrically connected to each other at the gold plated portions by applying given heat and supersonic wave. A heat sink 100 is made from a low thermal-expansion Cu/W type material. In this embodiment, a part of the conductor pattern (82) formed on the substrate serves as a ground, which is possible to be arranged near to a semiconductor chip to be mounted (not shown) as compared with the ground ring of the above second embodiment, so that a length of a gold wire (not shown) connecting the semiconductor chip to the ground can be shortened and hence an inductance component based on the length of the gold wire can be reduced. Further, the inner leads 92 of the lead frame 90 connected to the conductor pattern 82 of the substrate are alternately arranged to the remaining inner leads 94 of the lead frame 90, while all of the inner leads 92 and 94 are fixed to the substrate 80 through a layer 84 of an adhesive formed on the outer peripheral portion thereof and the top portions of the inner leads 94 are also fixed to the substrate through a layer 86 of an adhesive disposed on the conductor pattern 82 and the substrate in the vicinity of a cavity 88, so that the arrangement of the inner leads 92, 94 in the lead frame 90 is a zigzag 2 tier structure (two-stage bonding structure) through the proper adhesive layers 84, 86 and hence the wiring capacity of 2 times or more can effectively be realized. The thus obtained semiconductor chip carrier can easily mount a small-size semiconductor chip having fine electrode portions.

As mentioned above, in the semiconductor device according to the invention, there are remarkable effects as mentioned below:

(1) A near-by arrangement of materials having good thermal conductivity is attained by adhering the conductor pattern of the substrate and the inner leads of the lead frame to each other through the adhesive layer, so that the heat dissipation of the resulting semiconductor device is more improved;

(2) The degree of freedom in the design of the semiconductor chip carrier is increased to considerably enlarge the wiring region and the mounting region of the semiconductor chip and hence facilitate the design in the mounting of many semiconductor chips; and the like.

What is claimed is:

1. A semiconductor device comprising a semiconductor chip carrier and a semiconductor chip packaged in the semiconductor chip carrier with a resin; said semiconductor chip carrier comprising a printed wiring substrate provided at at least both surfaces with conductor patterns, a first layer of an adhesive formed on at least an outer peripheral portion of a front surface of the substrate, a second layer of an adhesive formed on each of said conduction patterns of the substrate, a lead frame joined to the substrate through the adhesive layers and comprised of plural leads for external connection, and said each of said conduction patterns being electrically connected to a part of inner leads of the lead frame.

2. The semiconductor device according to claim 1, wherein said printed wiring substrate is provided at its rear surface side with a heat sink.

3. The semiconductor device according to claim 2, wherein said semiconductor chip is directly mounted on said heat sink.

4. The semiconductor device according to claim 1, wherein said adhesive layer is composed of a thermosetting resin and has a thickness of 5–100 μm.

* * * * *